Oct. 22, 1963 E. N. HASALA ET AL 3,108,031

APPARATUS FOR ETCHING CURVED METAL PLATES

Filed April 15, 1960 3 Sheets-Sheet 1

INVENTORS

ERNEST N. HASALA

GEORGE P. REGAN JR.

BY Flehr & Swain

ATTORNEYS

APPARATUS FOR ETCHING CURVED METAL PLATES

INVENTORS
ERNEST N. HASALA
GEORGE P. REGAN JR.
BY Flehr & Swain
ATTORNEYS

APPARATUS FOR ETCHING CURVED METAL PLATES

Filed April 15, 1960 3 Sheets-Sheet 3

INVENTOR.
Ernest N. Hasala
BY George P. Regan Jr.
Flehr and Swain
Attorneys

United States Patent Office

Patented Oct. 22, 1963

3,108,031

APPARATUS FOR ETCHING CURVED METAL PLATES

Ernest N. Hasala, 30 Cornwall St., San Francisco, Calif., and George P. Regan, Jr., 1420 Drake, Burlingame, Calif.

Filed Apr. 15, 1960, Ser. No. 22,657
8 Claims. (Cl. 156—345)

This invention relates generally to apparatus and methods for etching metal plates, such as printing plates, and more particularly relates to such apparatus and methods by which curved printing plates can be uniformly etched to provide raised images of exceptional quality. This is a continuation-in-part of our previously filed application Serial No. 834,036, filed August 17, 1959, now abandoned.

In the making of a commercial metal printing plate (e.g. zinc, magnesium or copper), the plate is first coated with a photosensitive resist material, exposed to a powerful light image, and then treated to render the exposed portions resistant to the action of the etching fluid. The next step is to etch the surface of the metal so as to form an image in relief. There is considerable difficulty however in carrying out the etching operation, and particularly in obtaining a consistently uniform etch of the plate surface. Where the plate is exposed to greater amounts of etching fluid, the fluid soon begins to attack the metal lying beneath the resist material, with consequent undercutting and deterioration of the image.

Various procedures and techniques have been developed for the purpose of etching flat metal printing plates to insure a desired uniformity of etch. One widely used procedure employs a series of repetitive etching steps, including a stepwise application of resist material in powder form between each etch. Machines have also been developed to carry out the so-called "powderless" etch technique in which etching is accomplished in a single step, a typical machine being illustrated in U.S. Patent 2,669,048. In general, these machines mount the plates in a horizontal plane to minimize the problems of gravity flow, and sometimes the plate is cyclically rotated in opposite directions for the purpose of removing excess etching fluid. We have found that although such apparatus is satisfactory for flat plates, it is entirely unsuited for curved or semicylindrical plates of the type handled by the apparatus of the present invention.

In general, it is an object of the present invention to provide an apparatus and method for etching a curved metal printing plate whereby a uniform controllable etch can be obtained at each operation, on a successful commercial basis.

Another object of the invention is to provide an apparatus and method for this purpose which will provide a curved image in relief, and of exceptional character.

Another object of the invention is to provide novel plate etching apparatus which is relatively simple in construction and operation, and capable of effective use in curved plate etching operations.

Other objects and advantages of the invention will be apparent from the following description and from the drawing in which.

Figure 2:
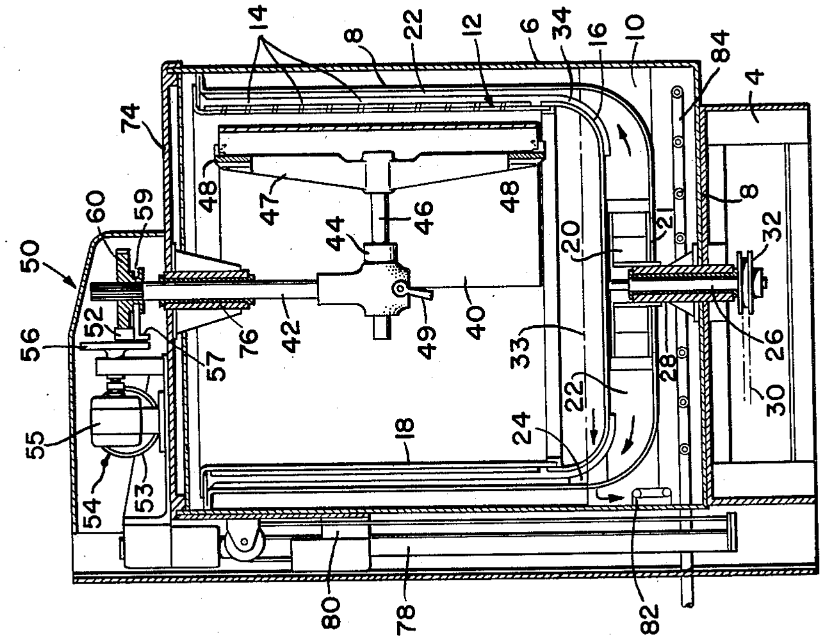
FIGURE 2 is a view in section and elevation taken along the line 2—2 of FIGURE 1.

In general, our apparatus consists of means for mounting a curved printing plate within an enclosing tank or housing. Driving means is provided whereby the plate is oscillated about its axis and simultaneously reciprocated in a direction longitudinally of its axis. Spray means generally surrounding the mounted plate serves to direct spray streams of etching fluid against the outer peripheral surface of the plate, whereby the entire area of the plate surface is flooded with a film of fluid. The individual spray streams are discharged from an area conforming to a cylindrical surface that is concentric with said axis, and the streams are directed inwardly towards this axis, whereby as viewed in the direction of the axis, the streams are inwardly convergent. Our method involves certain procedural steps which serve to provide a high quality etch.

Referring to the drawings, 4 represents a base frame for the support of a substantially cylindrical outer tank 6. A cylindrical shell 8 is rigidly supported within the tank 6, and the space between the tank and the shell 8 provides a reservoir or space 10 for a quantity of etching fluid. An inner cylindrical shell 12 having perforations 14 is also provided, and, as illustrated, it is removably seated on a lower fixed annular bottom portion 16. This construction permits the use of interchangeable inner shells 12 of differing dimensions, to accommodate curved plates of different sizes and diameters without change in the essential relationship to the spray. It also permits the use of shells having perforations of different size or with different distribution patterns. Suitable gasket or like sealing means (not shown) is provided for the upper and lower ends of shell 12.

An impeller 20 is positioned between the bottom of shell 8 and the bottom portion 16. The inlet side of the impeller is in communication with the reservoir 10 through an annular opening 21 provided in the bottom of the outer shell 12. As will be explained, the impeller functions during an etching operation to pump etching fluid upwardly through the space or passage 22 between the shells, and through the perforations 14. The etching fluid returns to the reservoir through one or more conduits 24 located below the inner shell 12.

The impeller is supported for rotation by means of a shaft 26 journalled in a sleeve 28 carried by and extending through the bottoms of the outer housing 8 and tank 6, and the base frame 4. The impeller can be rotated by any suitable source of power, such as a motor driven belt 30 operable to rotate a sheave 32 that is fixed to the shaft 26. Assuming that etching fluid is introduced into the machine to the level 33, rotation of the impeller forces the fluid outward in the space 22 and up between the shells to the apertures 14. Preferably the power source for the belt 30 can be controlled to operate at different speeds, to achieve a desired fluid pressure in the annular space 22.

Figure 6:
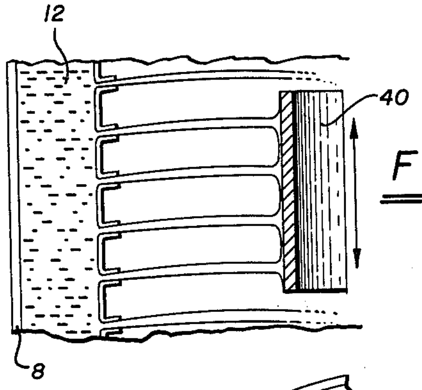
FIGURE 6 is a side elevational schematic view showing the manner in which etching fluid is sprayed upon the plate.
Figure 7:
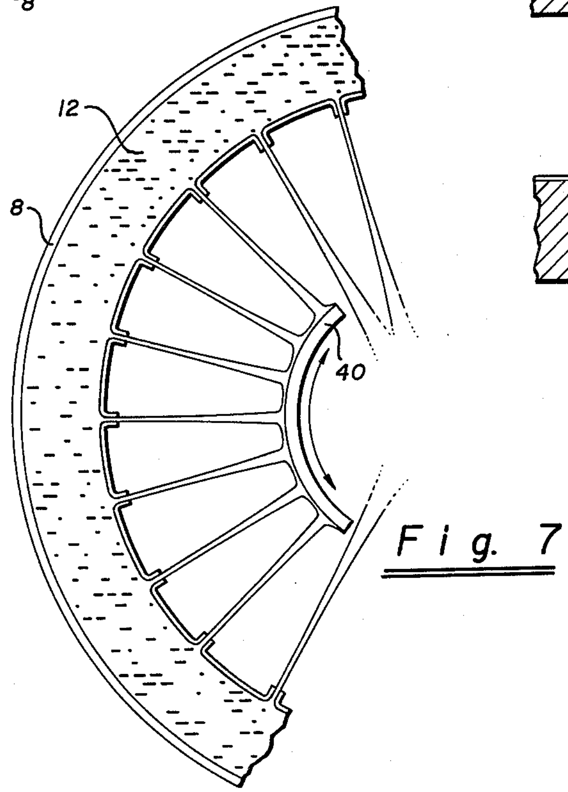
FIGURE 7 is a view like FIGURE 6 but in plan.

The apertures 14 are distributed in a desired pattern over the removable upper shell 18, and serve to direct the etching fluid in spray streams converging generally on the axis of the inner shell 12 (FIGURE 7). Preferably the apertures 14 direct the individual spray streams upwardly so as to counteract the effect of gravity, as shown schematically in FIGURE 6. If desired, a plurality of vertically extending baffles 34 may also be provided on the outer periphery of the housing 12, to equalize the flow of etching fluid to the sprays.

Figure 1:
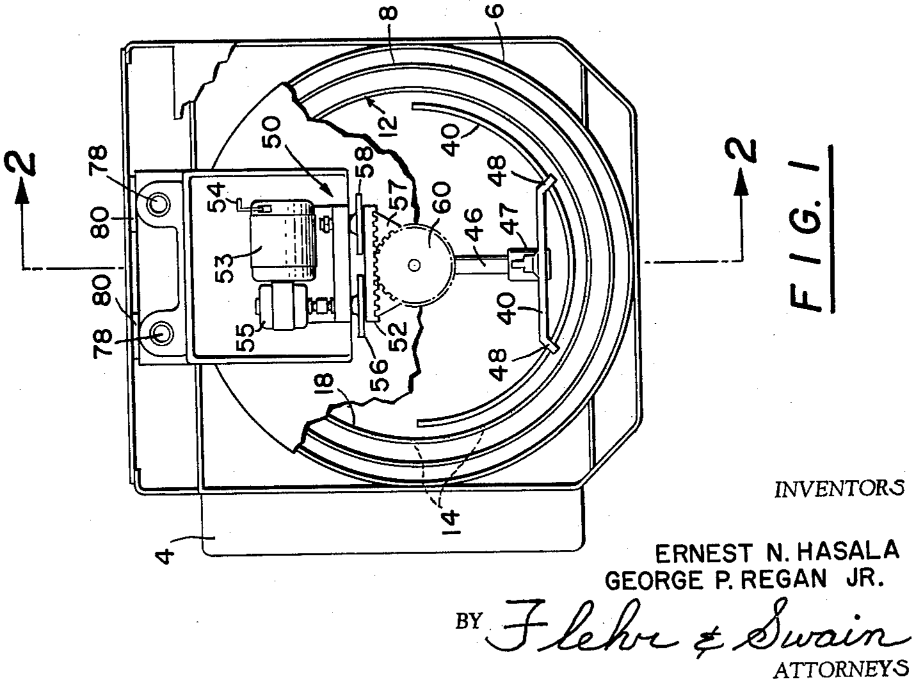
FIGURE 1 is a view in top plan of an etching machine embodying the invention, with parts broken away to reveal interior structure.

As illustrated in FIGURE 1, the curved plate 40 to be etched is supported for relative movements concentrically of the shell by means of the vertically extending shaft 42. The plate is rigidly held for movements with the shaft by a slide mount 44, which adjustably positions a radial support 46 for a plate holder 47. The latter may include adjustable clamp elements 48 to hold plates of different sizes and diameters. Preferably means are also provided by which the plate holder and slide mount can be rotated or otherwise reversed as to position so that the lower end is positioned at the top, for example, a pivot assembly associated with the locking lever 49.

The shaft 42 is simultaneously subjected to axial reciprocation and rotational oscillation to effect cyclic movement of the plate on a surface of revolution corresponding to a cylindrical surface that is coincident with the surface of the plate, concentrically of the shell 12. One mechanism for effecting this motion (indicated generally at 50 in FIGURE 3), includes a horizontally extending rack 52, a variable speed motor 53 adapted to oscillate the rack in a vertical plane, a speed control lever 54 for the motor, and a suitable speed reducing unit 55 (e.g., gearing). The rack is pinned at one end to a rotating disk 56, driven by the speed reducing unit, and at the other end to an idler disk 58. Protruding outward and movable with the rack is an integral lift bar 57. The bar 57 is slidably received in an annular groove 59 provided in a gear 60 keyed to the top of the shaft 42, and functions to axially reciprocate the shaft 42 with each rotation of the disk 56. The bar 57 also functions to hold the gear 60 in a position of continuous engagement with the rack 52, so that the shaft 42 is simultaneously subjected to rotational reciprocation, rotating first one way and then the other, as the rack performs its oscillatory motion.

Figure 3:
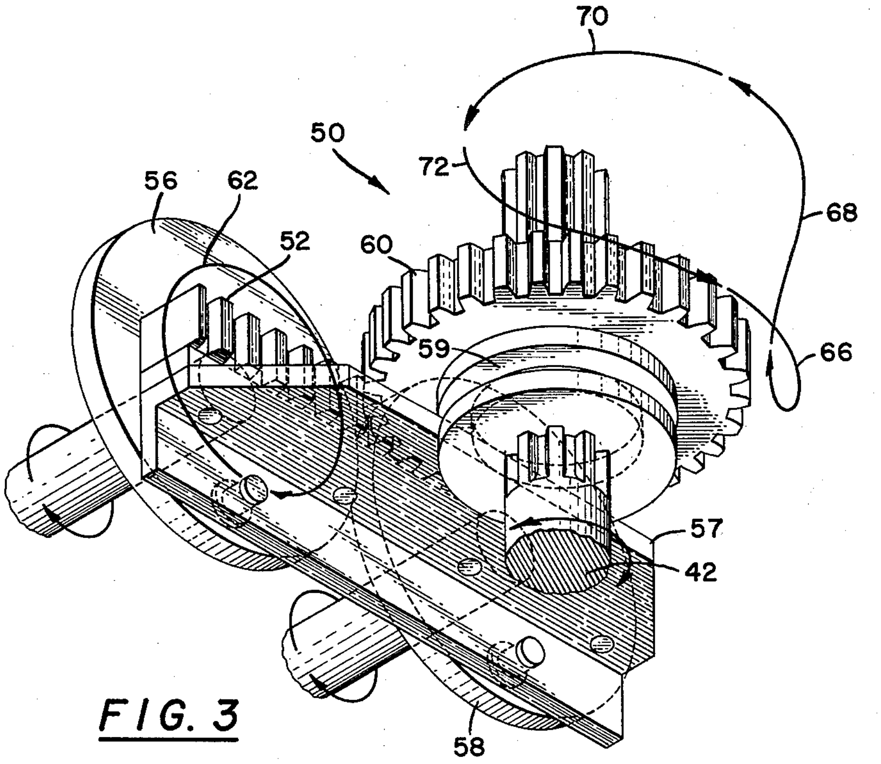
FIGURE 3 is a detail view in perspective, showing one form of driving means for the machine.
Figure 4:
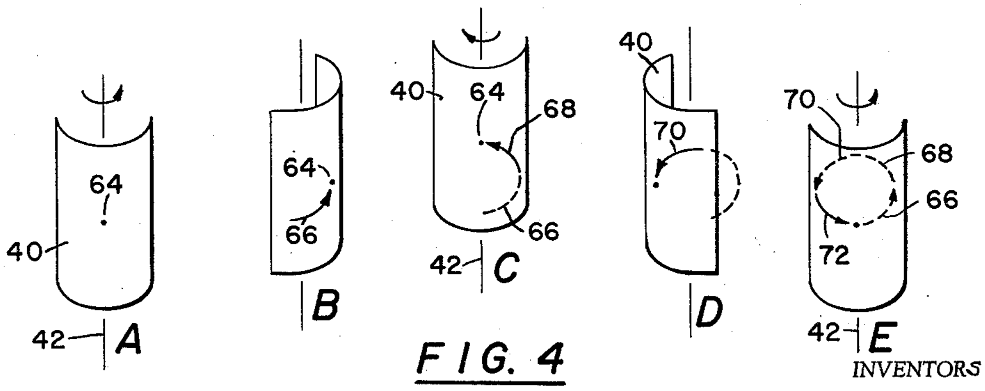
FIGURE 4 is a series of diagrammatic representations, illustrating the movement of a curved plate during the etching operation.

The effect of imparting simultaneous axial and rotational reciprocation to the shaft 42, is to cause the curved plate to oscillate about its axis so that all points on its surface transcribe curved oscillatory patterns in concentric relation to the shell 12. This oscillatory motion is illustrated in the sequence positions of 4A to 4E and by the arrows in FIGURE 3. Thus FIGURE 4A illustrates the position of the plate 40 when the rack 52 is in its lowermost position (FIGURE 3). Assuming clockwise oscillation of the rack (arrow 62 in FIGURE 3) FIGURE 4B illustrates the position of the plate 40 when the rack has rotated 90° to a position midway between its top and bottom positions. It will be observed that the plate oscillates counterclockwise so that a point 64 on its surface moves in the direction of the arrow 66. As the rack reverses direction and oscillates upward to the right, the plate 40 oscillates upward and to the left as illustrated by the arrow 68. Continued movement of the rack downward and to the right causes the plate to oscillate downward and to the left as illustrated by the arrow 70. Further rotation of the rack downward and to the left causes the plate to rotate downward and to the right (arrow 72), until both the rack and plate reach their original positions.

Figure 5:
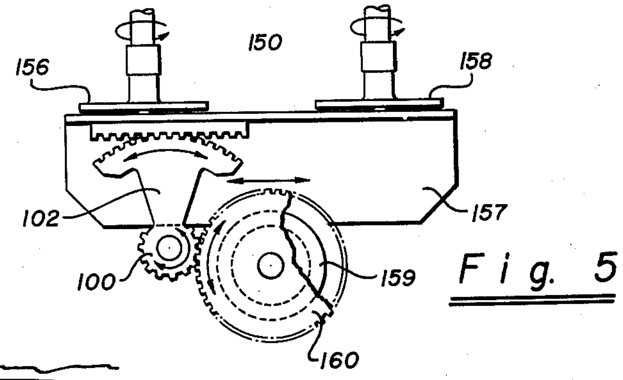
FIGURE 5 is a view like FIGURE 3, but showing a modification of the driving gear.

The sequence of plate positions just described produces patterns depending on the extent to which the rotary motion of the drive disk 56 is converted into axial and rotational reciprocation of the shaft 42, and the size (i.e., radius of curvature) of the plate 40. In general, however, it is desirable to establish the pattern for a particular machine so as to reduce to a minimum the number of machine adjustments required. In the embodiment illustrated in FIGURE 5, the oscillatory mechanism 150 includes a combination spur and sector gear 100, 102 interposed between the oscillatory rack 152 and shaft gear 160. As will be understood the relative diameters of these gear components will determine the particular oscillatory pattern obtained. In general, we have found it desirable for the pattern of movement of the plate 40 to be generally circular. In other words, with respect to a fixed point of reference, it is desirable that a generally circular path be traced upon the plate by the etching fluid. The drive gearing shown in FIGURE 5 is particularly desirable for this purpose, the drive ratios preferably being selected so that the aforesaid trace path upon a plate of intermediate size will be substantially circular. With larger or smaller plates, the trace paths for the same drive ratios will be slightly elliptical.

Referring to FIGURE 2, both the motor 54 and the driving mechanism 50 are shown supported on a cover 74 for the etching tank, the latter being provided with a centrally apertured slide bearing 76 for the shaft 42. This construction makes it possible to support both the plate 40 and its oscillating mechanism on a vertically movable slide mount, represented by the posts 78 and the cross supporting slide brackets 80. If desired, a suitable pulley and weight system can also be employed to counter balance the weight of the operating mechanism 50, in the manner illustrated. It will be understood that upward movement of the posts 78 will cause the cover 74, the driving mechanism, the shaft 42 and the plate mount 47 to be lifted clear of the etching tank for positioning or replacement of a curved printing plate undergoing treatment.

During the etching operation, it is desirable that the temperature of the etching solution in the reservoir 10 be maintained with a desired temperature range, to thereby insure optimum conditions of etch. This is accomplished in the apparatus of the invention by means of a heating element in the form of a pipe coil 82, which may be suitably connected to a source of heat transfer fluid (not shown) at a desired temperature. During the initial stages of the etching operation, the element 82 permits the temperature of the etching fluid to be raised to the desired level. Since the etching reaction is exothermic in nature, it is also desirable to provide means such as the refrigeration coils 84 permitting dissipation of heat. The coils 84 are likewise supplied with heat transfer fluid at desired low temperature. It will be understood that a suitable temperature control may also be provided to regulate the flow of heat transfer fluid to the heating and refrigeration coils, and operable in response to variations in temperature of the etching fluid in the reservoir 10. As such heat transfer system can be of any conventional type, it is not described in further detail.

To describe the operation of the above machine and our method, it is assumbed that a pre-curved, zinc plate is to be etched for use in a cylinder (rotary) press. It is further assumed that the so-called powderless etch (single step) technique is to be used, employing an etching solution of the following general type:

| | | |
|---|---|---|
| Nitric acid (38 to 42%) | liters | 16 |
| Naphtha | do | 3 |
| Dioctyl sodium sulfo-succinate (e.g., Aerosol OT American Cyanamid Co.) | milliliters | 400 |
| Water | liters | 110 |

It is generally considered that the Aerosol content of such etching fluid aids in control in that it tends by a masking effect to prevent overetching on the edges or shoulders that define image boundaries. Such a material can be referred to as a masking agent.

Sufficient etching fluid is placed in the etching tank to bring the upper surface of the solution to approximately the level indicated at 33 in FIGURE 1. With the cover 74 in raised position, the plate to be etched is positioned within the clamps 48 of the plate mount so that its axis is substantially coincident with that of the shaft 42. The cover is now lowered to position the plate within the perforated shell 12, and the motor 53 for the driving mechanism 50 energized by the lever 54. The motor operating the impeller 20 is now set into operation causing etching solution to be impelled upwardly into the annular space 22 and through the apertures 14 into spray streams converging toward and impacting the outer surface of the oscillating plate 40. Excess etching fluid leaving the surface of the plate returns to the reservoir 10 through the conduits 24. Throughout the operation of the machine, the etching solution is maintained in mixed agitated condition in reservoir 10 by virtue of the action of the impeller and the flow of fluid through its closed recirculation path.

Figure 8:
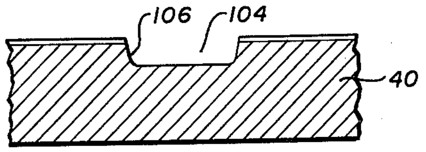
FIGURES 8 and 9 are enlarged detail views illustrating etching effects obtained in accordance with the invention.

It may be explained at this point that in conventional etching practice, the etching fluid or solution functions to remove unexposed portions of the metal plate to form an image in relief (the exposed image portions of the plate being protected by the resist coating). Preferably the action of the etching fluid should be such that sharply defined edges are produced to define image boundaries coincident with the normal plate surface. As etching proceeds beneath the plate surface, it is desirable for the etching action to produce a boundary edge or shoulder sloping away from the edge, thereby to insure proper support for such boundary edges during mechanical printing operations. The foregoing can be made clear by reference to schematic FIGURE 8. Depression 104 represents an area which has been removed by etching. Desirable sloping shoulders are indicated at 106.

In the previously mentioned powderless etch technique, as applied to flat plates, the type of desirable etch described above is achieved by relying primarily upon the masking ingredient or ingredients (e.g., Aerosol), contained in the etching fluid, which has the characteristic of clinging to relief edges to protect them from excessive or too rapid etching by the acid. It has been found that when the same types of etching fluid are applied to curved printing plates, one cannot rely upon the effect of masking ingredients contained in the fluid to obtain the results desired, due presumably to the different physical conditions.

By the use of our method, we accomplish a desired control of the etch by the use of additional control factors. Thus during the first or initial part of the etching period, the motor 53 is operated at a relatively high speed to produce a corresponding rapid oscillatory movement of the plate. Thereafter the driving speed is reduced for the remaining or final part of the etch. We also vary the speed of rotation of the impeller 20 to vary the fluid pressure in the space 22, as we have found that the scrubbing effect tends to be proportional to the velocity of the converging spray stream. Thus, a higher velocity is desired in the initial stage and a lower velocity in the final stage of the etching operation.

Figure 9:
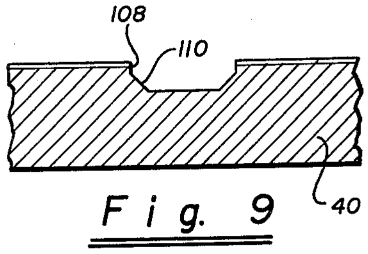

By way of example, in one instance, the plate being etched was curved to a radius of 9.79 inches and was semi-cylindrical. Driving means was arranged whereby the amplitude of the reciprocating and oscillatory movements was about 2 inches. For the initial part of the etching period, the motor speed was such that the plate completed 40 cyclic movements per minute. The impeller speed was sufficient to provide a fluid pressure of 1.75 p.s.i. (gauge). For the second and final part of the etching period, the motor speed was such that the plate completed about 24 cycles of movement per minute. The impeller speed was correspondingly reduced to provide a fluid pressure of 1.0 p.s.i. The fluid used was the same as that previously cited by way of example. The temperature of the fluid was controlled whereby it remained constant at about 70° F. throughout the etching operation. The perforations in the shell 12 (1000) were each ⅛ inch in diameter and were disposed about 1.25 inches apart. The first or high speed part of the etching period lasted about 1.5 minutes, for a total etch period of 2.5 to 3 minutes. The etching effect obtained under such operating conditions gave the type of etch described in connection with FIGURE 9, and in general the quality of the finished plate was superior to the quality obtained in conventional flat plate etching, using methods as previously described. As shown in FIGURE 9, the first part of the etching period produced the sharp edges 108, and the last part deepened the etch and provided the sloped shoulders 110.

Particularly the curved plates obtained by our method are superior with respect to the sharpness of image definition, the absence of undercutting on boundary edges, and in the formation of optimum supporting shoulders of the type illustrated in FIGURE 9.

In accordance with our observations, the control over the etch produced by our method may be due to a number of factors. Particularly it is believed that during the initial part of the etching period, the oscillatory movement inhibits the masking effect of masking ingredients in the etching fluid, thus making possible a more rapid etching effect during this part of the complete etching period. It is believed that this is due at least in part to centrifugal effects. Also it is believed that the scrubbing effect between the layer of fluid upon the plate and the surface of the moving plate, tends to accelerate the etching action and to inhibit masking. For the second and final part of the etching period, the slower rate of movement of the plate makes for reduced centrifugal effects, thus giving the masking ingredients of the fluid better opportunity to associate itself with sharp edges, thereby reducing or inhibiting the etching effect of the acid in the edges, and affording an opportunity for the image zones to be deepened without undercutting. Also, the scrubbing effect previously mentioned is reduced during the final part of the etching, which again gives a better opportunity for the masking agents to associate themselves with the sharp edges.

Aside from the factors just mentioned, movement of the plate in a near circular path aids in obtaining a relatively uniform scrubbing effect between the etching fluid and the surfaces of the plate which it contacts, considering the fact that the image boundary edges where such sharp edges are produced, extend in all directions. Another factor which is believed to have some effect in producing the desired results is the fact that the etching fluid is applied and removed under uniform conditions, whereby the surface of the plate is continually supplied with fresh etching fluid, while the fluid after being applied is continuously removed after a predetermined period of contact. The effect of gravity upon the applied fluid is negligible, due to the fact that the fluid is removed before there is any substantial tendency to flow down over the surface of the plate by gravity.

We claim:

1. In apparatus for etching curved printing metal plates, an outer tank, concentric inner and outer shells mounted with the tank, the inner shell being perforated, means for pumping etching fluid upward between said shells to cause the same to be discharged through the perforations in a spray converging on the axis of said shells, vertical shaft means within said perforated shell and mounted for relative rotary and reciprocating movements with respect to the axis of said shaft means, a plate mount carried by and extending radially from said shaft means and adapted to support one of said plates to extend along said axis, and drive means for imparting simultaneous reciprocation movements in a direction along and rotary oscillation movements about the axis of said shaft means.

2. Apparatus as in claim 1 wherein said means for pumping etching fluid between said housings includes an impeller mounted co-axially of said shaft means and located at the lower ends of the shells.

3. In an apparatus for etching curved printing plates, an outer substantially cylindrical shell having a closed bottom, a removable interior shell conforming in shape to said outer shell and having perforations over at least a portion of its surface, means forming a reservoir for etching solution in fluid communication with said inner shell, means for pumping etching fluid from said reservoir and into the space between said shells whereby said fluid is discharged inwardly through said perforations as spray streams converging on the axis of said shells, vertical shaft means extending downwardly into said inner shell, and means for imparting simultaneous axial reciprocating and rotational oscillation to said shaft means, said last named means including a horizontally extending rack mounted for oscillation in a vertical plane, means oscillating said rack, gear means associated with the upper end of said vertical shaft means engageable with said rack, and slide means linking said rack and gear means to insure continuous cooperative engagement whereby both vertical and rotational components of the oscillation of said shaft means are imparted to a curved printing plate carried thereby.

4. An apparatus as in claim 3 wherein the perforations in said interior housing direct the inwardly converging spray streams in an upward direction.

5. An apparatus as in claim 3 wherein said reservoir is provided with heating means.

6. An apparatus as in claim 3 wherein said reservoir is provided with means for controlling the temperature of the fluid.

7. In an apparatus for etching curved printing plates, a vertical shaft, a plate mount carried by the shaft and adapted to support a curved plate in concentric fashion with respect to the shaft, spaced perforate and imperforate shells positioned in concentric relation to said vertical shaft, said perforate shell surrounding said curved printing plate, means for pumping etching fluid in the space between the shells and through the perforations in the perforate shell to form spray streams converging generally on said vertical shaft and curved plate, and means effecting simultaneous axial reciprocation and rotational oscillation of the shaft, whereby said curved plate is continuously oscillated on a cylinder of revolution in the etching spray emanating from said perforate shell.

8. An apparatus as in claim 7 wherein baffle means are provided between said perforate and imperforate shells to equalize the flow of etching fluid to said perforations.

References Cited in the file of this patent

UNITED STATES PATENTS

| | | |
|---|---|---|
| 1,961,773 | McKay | June 5, 1934 |
| 2,416,716 | Ross | Mar. 4, 1947 |
| 2,640,765 | Easley et al. | June 2, 1953 |
| 2,763,536 | Easley et al. | Sept. 18, 1956 |
| 2,828,194 | Hopkins et al. | Mar. 25, 1958 |
| 2,836,917 | Schutt et al. | June 3, 1958 |
| 2,857,697 | Schutt et al. | Oct. 28, 1958 |
| 2,879,616 | Lear | Mar. 31, 1959 |
| 2,926,076 | Guenst | Feb. 23, 1960 |
| 2,995,851 | Dirats | Aug. 15, 1961 |

FOREIGN PATENTS

| | | |
|---|---|---|
| 23,493 | Great Britain | 1905 |
| 786,293 | Great Britain | Nov. 13, 1957 |
| 957,895 | Germany | Feb. 7, 1957 |